(12) United States Patent
Pelteku

(10) Patent No.: US 9,835,931 B1
(45) Date of Patent: Dec. 5, 2017

(54) DIFFERENTIAL VOLTAGE-MODE INTEGRATE AND DUMP PHOTONIC ANALOG TO DIGITAL CONVERTER (PADC)

(71) Applicant: Rockwell Collins, Inc., Cedar Rapids, IA (US)

(72) Inventor: Altin E. Pelteku, Severna Park, MD (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 15/482,498

(22) Filed: Apr. 7, 2017

(51) Int. Cl.
*H03M 1/00* (2006.01)
*G02F 7/00* (2006.01)
*G02F 1/133* (2006.01)
*H02M 7/02* (2006.01)
*H02M 1/092* (2006.01)
*H02M 1/00* (2006.01)

(52) U.S. Cl.
CPC ............ *G02F 7/00* (2013.01); *G02F 1/13318* (2013.01); *H02M 1/092* (2013.01); *H02M 7/02* (2013.01); *H03M 1/001* (2013.01); *G02F 2001/13312* (2013.01); *G02F 2001/13324* (2013.01); *H02M 2001/0041* (2013.01); *H03M 2201/51* (2013.01)

(58) Field of Classification Search
CPC ....... G06F 17/2217; H03M 7/70; H03M 7/02; H03M 1/001; H03M 1/092; H03M 2201/51; G06K 9/6212; G06K 9/723; G02F 7/00
USPC .................................................. 341/137–155
See application file for complete search history.

(56) References Cited

U.S. PATENT DOCUMENTS

| | | | | |
|---|---|---|---|---|
| 6,188,342 B1* | 2/2001 | Gallo | ................... | H03M 1/368 341/137 |
| 8,442,402 B1* | 5/2013 | Zanoni | ................ | H03M 1/1245 341/137 |
| 8,446,305 B1* | 5/2013 | Zanoni | .................. | H03M 1/124 341/137 |
| 8,456,336 B1* | 6/2013 | Zanoni | ...................... | G02F 7/00 341/137 |
| 8,478,132 B1* | 7/2013 | Jepsen | ................. | H04B 10/614 398/152 |
| 8,548,331 B1* | 10/2013 | Zanoni | .................. | H04B 10/90 398/115 |
| 8,779,955 B1* | 7/2014 | Zanoni | ...................... | G02F 7/00 341/132 |

(Continued)

*Primary Examiner* — Lam T Mai
(74) *Attorney, Agent, or Firm* — Angel N. Gerdzhikov; Donna P. Suchy; Daniel M. Barbieri

(57) ABSTRACT

A voltage-mode integrate-and-dump photonic ADC front-end circuit includes a current integrator for immediately integrating current pulses onto a capacitor voltage, the current pulses converted by photodetectors from optical data pulses corresponding to a received analog input signal. The circuit may include dampeners for reducing voltage ringing and resulting intersymbol interference (ISI) to preserve SNR at high data rates. The integrating capacitor may be discharged by a reset switch based on clock signals generated by a master clock; the reset switch may include a pulse width controller enabling the integrating capacitor to track and hold the integrated voltage, rather than downstream sample-and-hold amplifiers. Quantizers and other signal processors generate digital signal output by sampling and digitizing the integrated voltage output of the current integrator.

20 Claims, 7 Drawing Sheets

(56) References Cited

U.S. PATENT DOCUMENTS

| | | | | |
|---|---|---|---|---|
| 8,928,510 B1* | 1/2015 | Zanoni | ............... | H03M 1/124 |
| | | | | 341/137 |
| 8,965,211 B1* | 2/2015 | Zanoni | ............... | H04B 10/61 |
| | | | | 341/137 |
| 9,197,471 B1* | 11/2015 | Zanoni | ............... | H04L 27/223 |
| 9,356,704 B1* | 5/2016 | Zanoni | ............... | H04B 10/61 |
| 2004/0262236 A1* | 12/2004 | Hoffmeier | ............... | C02F 1/325 |
| | | | | 250/504 R |
| 2012/0213531 A1* | 8/2012 | Nazarathy | ............... | H03M 1/145 |
| | | | | 398/202 |
| 2015/0070197 A1* | 3/2015 | Meacham | ............... | H03M 1/08 |
| | | | | 341/118 |

* cited by examiner

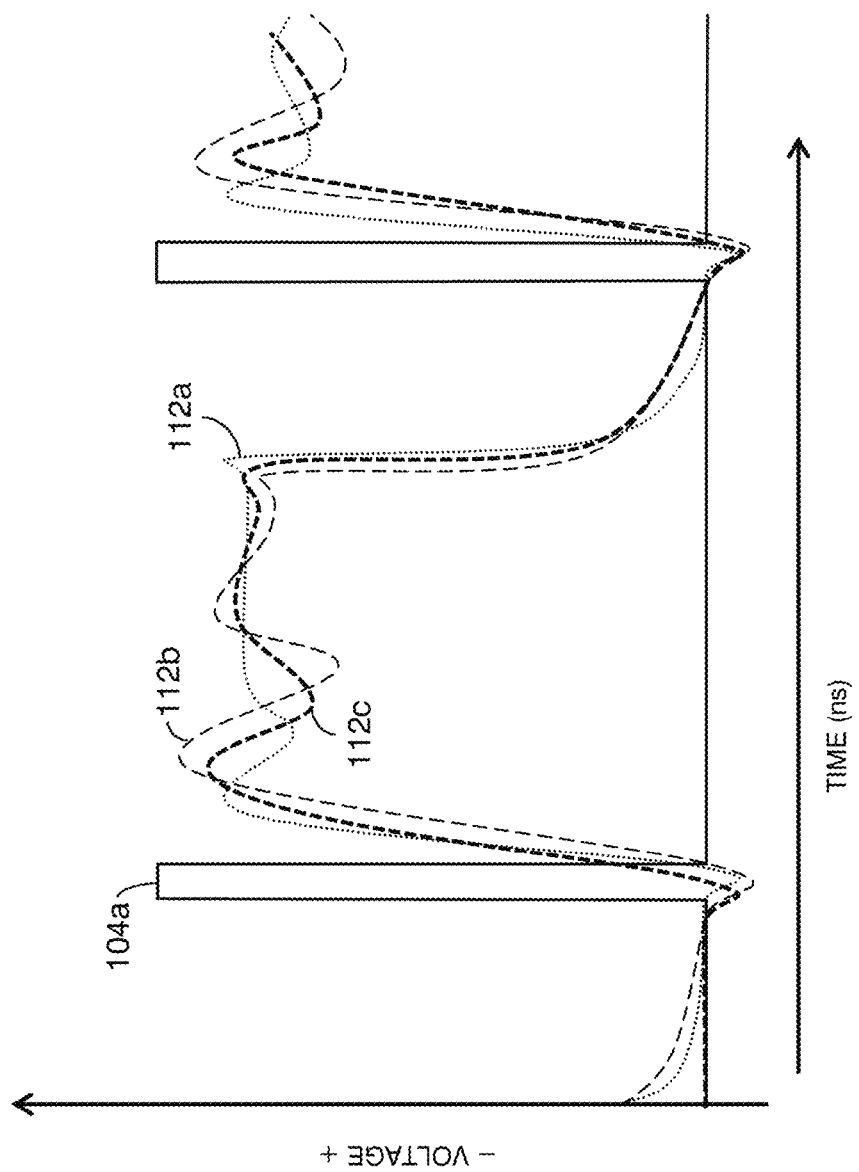

DIFFERENTIAL VOLTAGE-MODE INTEGRATE AND DUMP PHOTONIC ANALOG TO DIGITAL CONVERTER (PADC)

GOVERNMENT LICENSE RIGHTS

This invention was made with government support under Government Contract No. NR0000-14-C-0206, awarded by the National Reconnaissance Office. The government has certain rights in the invention.

BACKGROUND

Conventional photonic analog to digital converters (pADC) use a track-and-hold circuit to convert photodiode pulses to voltage signals for digitization. However, the signal to noise ratios (SNR) of current-mode integrate-and-dump pADC circuits may be limited. For example, current-mode circuits may include front-positioned 1:N dividers which inject noise and reduce SNR. In addition, current or voltage ringing within a pADC circuit may introduce memory effects and, ultimately, intersymbol interference (ISI), which may degrade overall performance and reduce bandwidth. Further, a significant amount of power for high-SNR applications may be consumed by track and hold amplifiers.

SUMMARY

In one aspect, embodiments of the inventive concepts disclosed herein are directed to a voltage-mode integrate-and-dump photonic analog-digital converter (pADC) front-end circuit. The circuit includes optical subsystems configured to generate optical data pulses based on a received analog data signal. The circuit includes photodetectors for generating current pulses based on the optical data pulses. The circuit includes current integrators wherein the current pulses are integrated onto a capacitor voltage; the current integrator includes a reset switch for discharging the integrating capacitor according to a master clock signal generated by a clock subsystem. The circuit includes quantizers and other signal processors for sampling and digitizing the integrated voltage output by the current integrator in the voltage domain.

In a further aspect, embodiments of the inventive concepts disclosed herein are directed to a differential voltage-mode integrate-and-dump pADC front-end circuit. The circuit includes paired optical subsystems configured to generate optical data pulses based on a received analog data signal. The circuit includes paired photodetectors for generating current pulses based on the optical data pulses. The circuit includes a current integrator wherein the current pulses generated by the paired photodetectors are integrated onto a capacitor voltage; the current integrator includes a reset switch for discharging the integrating capacitor according to a master clock signal generated by a clock subsystem. The circuit includes differential amplifiers for generating differential signals based on the integrated voltage output of the current integrator. Quantizers and other signal processors sample and digitize the differential signals to generate digital output.

In a still further aspect, embodiments of the inventive concepts disclosed herein are directed to a voltage-mode integrate-and-dump pADC front-end circuit without sample-and-hold amplifiers. The circuit includes optical subsystems configured to generate optical data pulses based on a received analog data signal. The circuit includes photodetectors for generating current pulses based on the optical data pulses. The circuit includes current integrators wherein the current pulses are integrated onto a capacitor voltage; the current integrator includes a reset switch for discharging the integrating capacitor according to a master clock signal generated by a clock subsystem. A pulse width controller connected to the reset switch enables adjustment of the pulse width of the clock signal, allowing more time each duty cycle for the capacitor voltage to settle and enabling the integrating capacitor to operate as a track-and-hold component. Downstream quantizers generate digital output based on the integrated voltage output of the current integrator.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIG. 3C illustrates the potential for current ringing and intersymbol interference (ISI) in the pADC front-end circuit of FIG. 1;

DETAILED DESCRIPTION OF EXEMPLARY EMBODIMENTS

Figure 1:
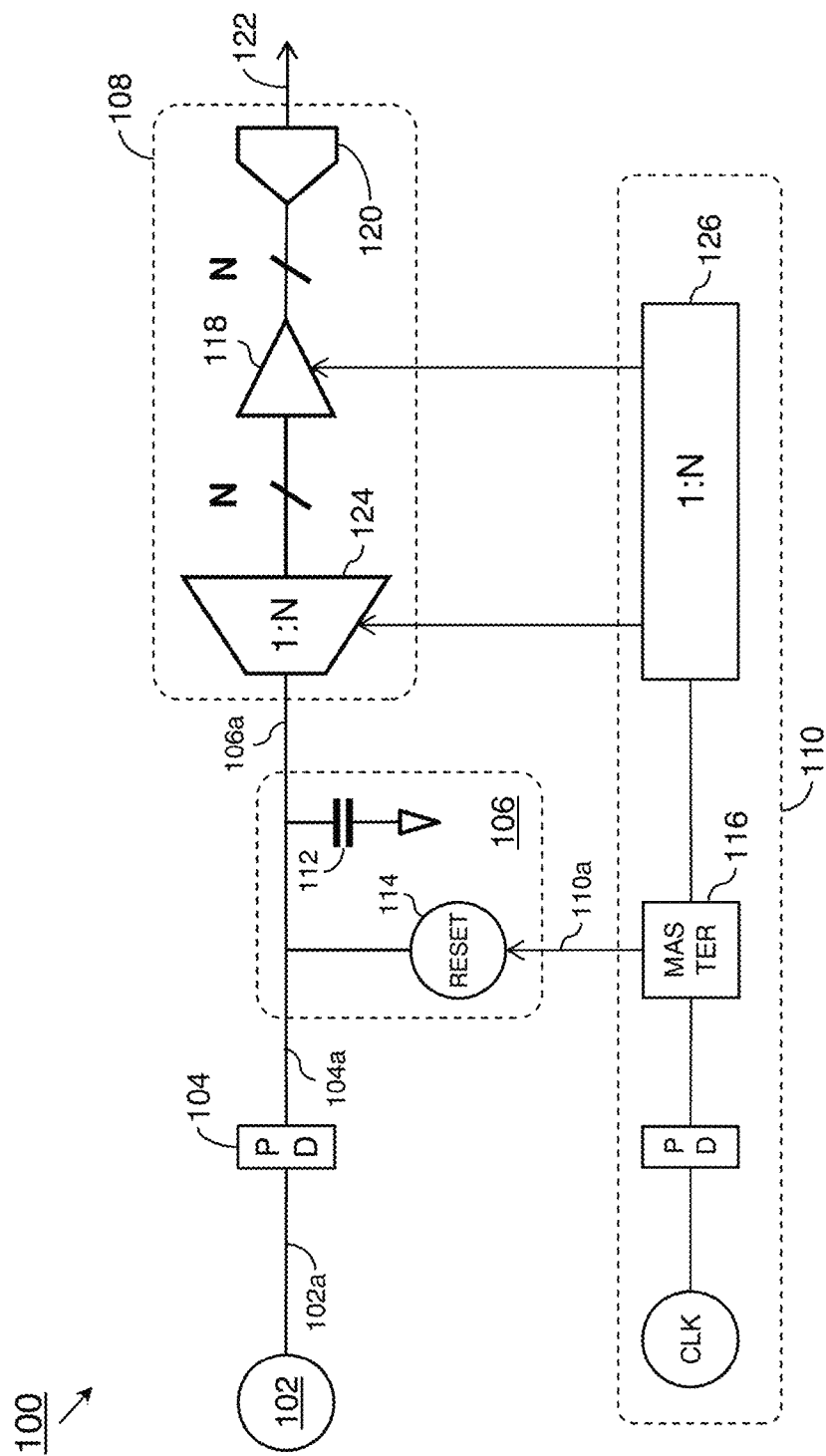
FIG. 1 is a diagrammatic illustration of an exemplary embodiment of a photonic analog-digital converter (pADC) front-end circuit according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a' and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a voltage-mode integrate-and-dump pADC front-end circuit. Generally, pADC applications provide significant improvements in performance over their electronic counterparts with respect to Effective Number of Bits (ENOB) and Spurious Free Dynamic Range (SFDR). pADC circuits may be configured to operate at gigasample speeds in, for example, radar, wireless/radio communications, signal intelligence (SIGINT), or electronic warfare. Rather than tracking and holding current pulses, the pADC front-end immediately integrates the current pulses onto a capacitor voltage, enabling faster operation and improving SNR with minimal interconnects or jitter. The circuit may further include dampeners to minimize ringing of the capacitor voltage without affecting SNR. Furthermore, the circuit may use integrating capacitors as integrate-and-hold components, enabling the removal of track-and-hold amplifiers.

Referring now to FIG. 1, an exemplary embodiment of a photonic analog-digital converter (pADC) front-end circuit 100 according to the inventive concepts disclosed herein may include an optical subsystem 102, one or more photodetectors 104, a current integrator 106, signal processors 108, and a clock subsystem 110. For example, the optical subsystem 102 may be connected to a receiver or antenna element configured for receiving an analog input signal, based on which the optical subsystem 102 may generate optical pulses (102a) (e.g., data pulses) corresponding to the analog input signal. The optical pulses 102a may be received by the photodetector 104 (e.g., photodiode), which generates electrical current pulses (104a) based on the received optical pulses. To minimize current ringing and optimize the signal/noise ratio (SNR) of the pADC front-end circuit 100, the current integrator 106 may include an integrating capacitor 112 and reset switch 114. For example, the current integrator 106 may directly integrate the current pulses 104a onto a capacitor voltage. The integrating capacitor 112 may hold the value of the integrated voltage, allowing for high speed operations (e.g., gigasamples per second) with minimal interconnects or jitter compared to, e.g., current-mode pADC circuits. The voltage across the integrating capacitor 112 may vary, for example, based on the amplitude of the optical pulses (102a). The reset switch 114 may be a field-effect transistor (FET) or other like component suitable for discharging the integrating capacitor 112 according to a repetition rate governed by clock signals (110a) generated by a master clock 116 of the clock subsystem 110.

The signal processors 108 may include a sample-and-hold circuit (118) as well as quantizers (120) for respectively sampling and digitizing the resulting integrated voltage (106a) in the voltage domain to generate a digital output 122. The signal processors 108 may include, in addition to or alternatively to the quantizers 120, analog-digital converters (ADC) of various configurations (e.g., Flash, pipeline, successive approximation register (SAR)). Depending on the speed of the quantizers 120, the signal processors 108 may include a 1:N demultiplexer 124 configured to lower the data rate of the integrated voltage 106a by separating the integrated voltage into N signal segments, each signal segment processed by a separate sample-and-hold circuit (118) and quantizer (120) for downstream processing into a single digital output signal (122). Sampling and digitizing of the N signal segments may be controlled by a 1:N clock divider (126) of the clock subsystem 110.

Figure 2A:
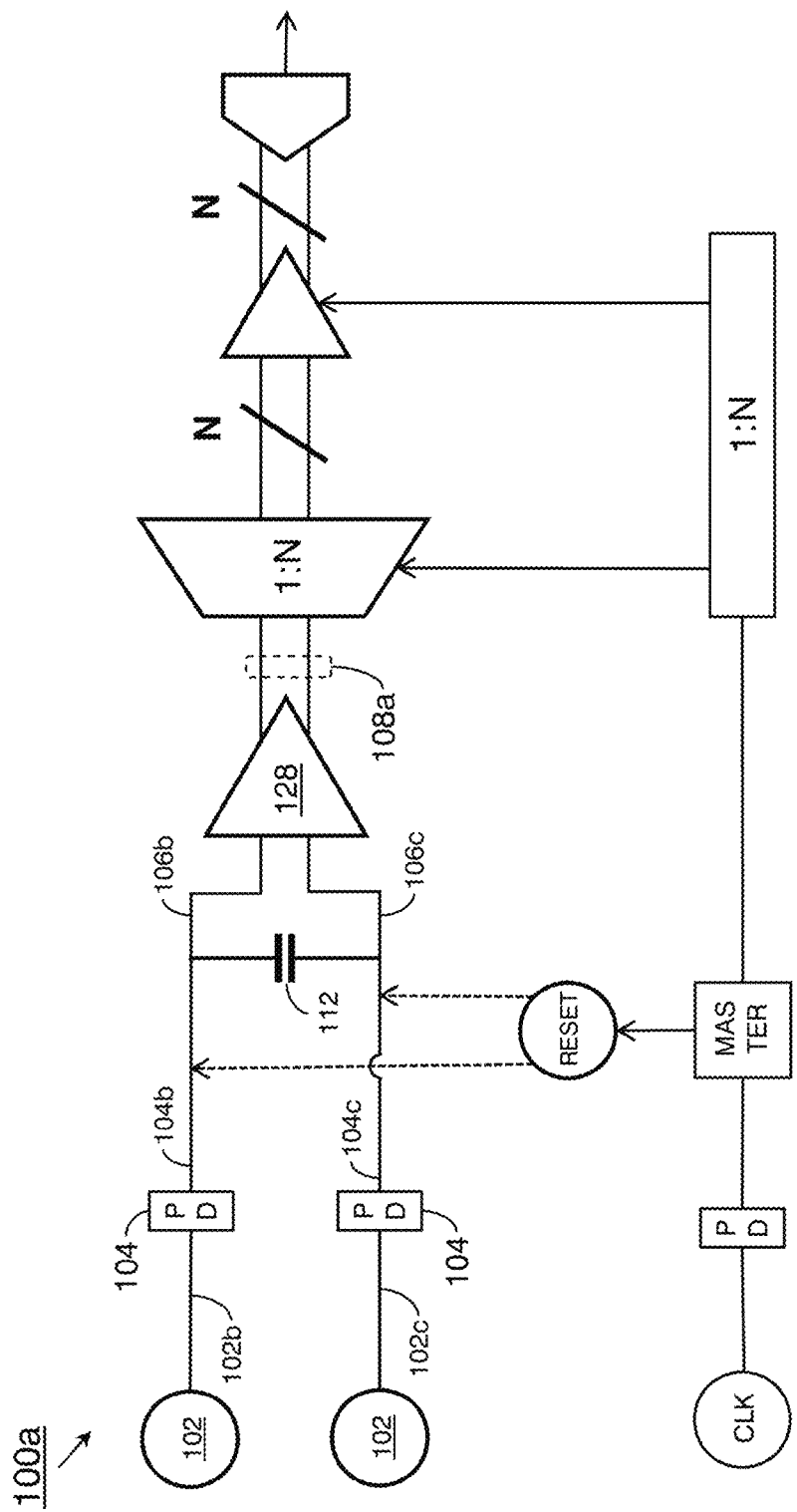
FIG. 2A is a diagrammatic illustration of a differential implementation of the pADC front-end circuit of FIG. 1.

Referring now to FIG. 2A, the differential pADC front-end circuit 100a may be implemented and may function similarly to the pADC front-end circuit 100 of FIG. 1, except that the pADC front-end circuit 100a may include a differential amplifier 128. For example, the pADC front-end circuit 100 of FIG. 1 may exhibit a degree of common-mode amplitude noise across the integrating capacitor 112 due to, e.g., amplified spontaneous emissions (ASE) associated with the optical pulses (102a, FIG. 1). The pADC front-end circuit 100a may eliminate ASE and common-mode noise by generating two sets of optical pulses (102b-c) via two optical subsystems 102. Two photodetectors 104 may generate two sets of current pulses (104b-c) based on the optical pulses 102b-c. The current integrator 106 may integrate the two current pulses 104b-c onto the capacitor voltage via the integrating capacitor 112. The differential amplifier 128 may generate a differential signal (108a) for sampling and digitizing based on the resulting integrated voltages (106b-c). As both integrated voltages 106b-c include the same common-mode noise, the differential signal 108a cancels out the noise voltage.

Figure 2B:
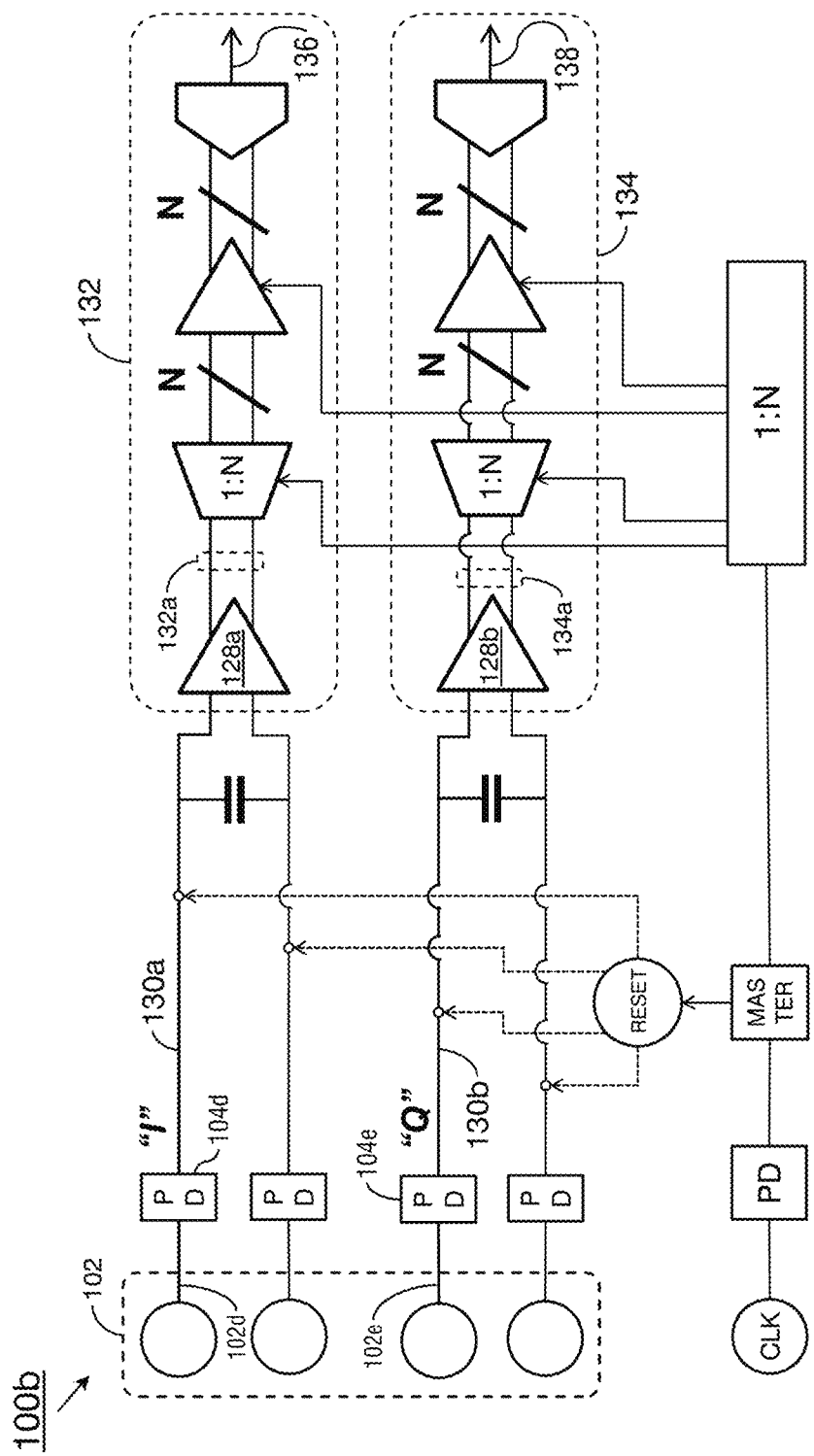
FIG. 2B is a diagrammatic illustration of a multi-channel implementation of the pADC front-end circuit of FIG. 2A.

Referring now to FIG. 2B, the multichannel pADC front-end circuit 100b may be implemented and may function similarly to the pADC front-end circuit 100 of FIG. 1 or the differential pADC front-end circuit 100a of FIG. 2A, except that the multichannel pADC front-end circuit 100b may include optical subsystems 102 for demodulating an analog input signal, or the corresponding optical pulses, into in-phase (I) optical components (102d) and quadrature (Q) optical components (102e). The photodetectors 104d-e of the multichannel pADC front-end circuit 100b may generate, based respectively on the I- and Q-optical components 102d-e, in-phase current pulses (I-pulses; 130a) and quadrature current pulses (Q-pulses; 130b). The I-pulses 130a and Q-pulses 130b may respectively feed signal processing channels 132, 134 (which may or may not include differential amplifiers 128a-b and differential signals 132a, 134a), generating digital I-channel output 136 and digital Q-channel output 138. Further processing of the digital I-channel output 136 and digital Q-channel output 138 may occur downstream from the multichannel pADC front-end circuit 100b (e.g., via a field programmable gate array (FPGA), application specific integrated circuit (ADIC), or similar modulation circuit (not shown)), and may include (but is not limited to) the extraction of signal constellations based on the digital I-channel output 136 and digital Q-channel output 138.

Figure 3A:
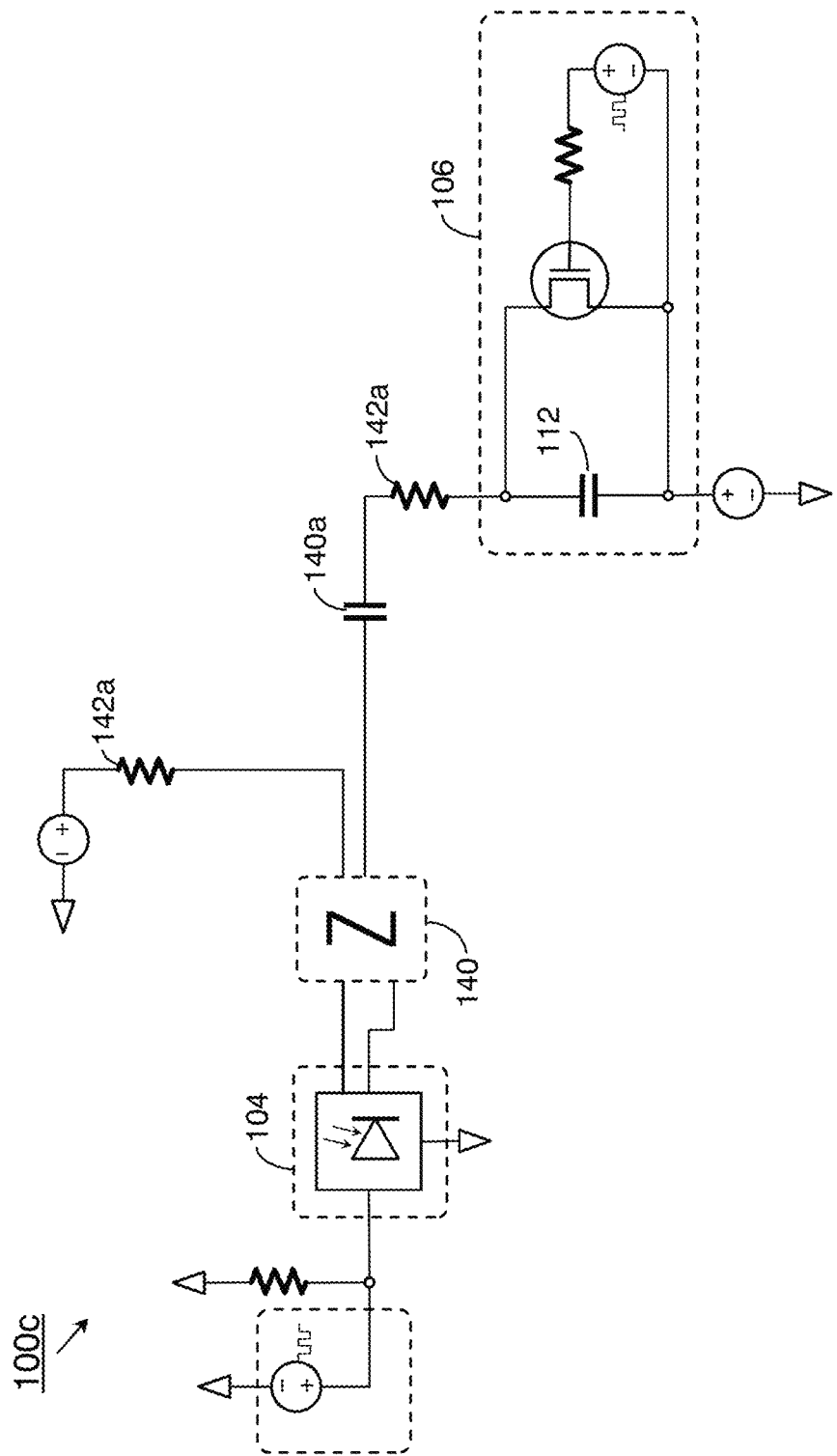
FIG. 3A is a schematic illustration of a dampening implementation of the pADC front-end circuit of FIG. 1.
Figure 3B:
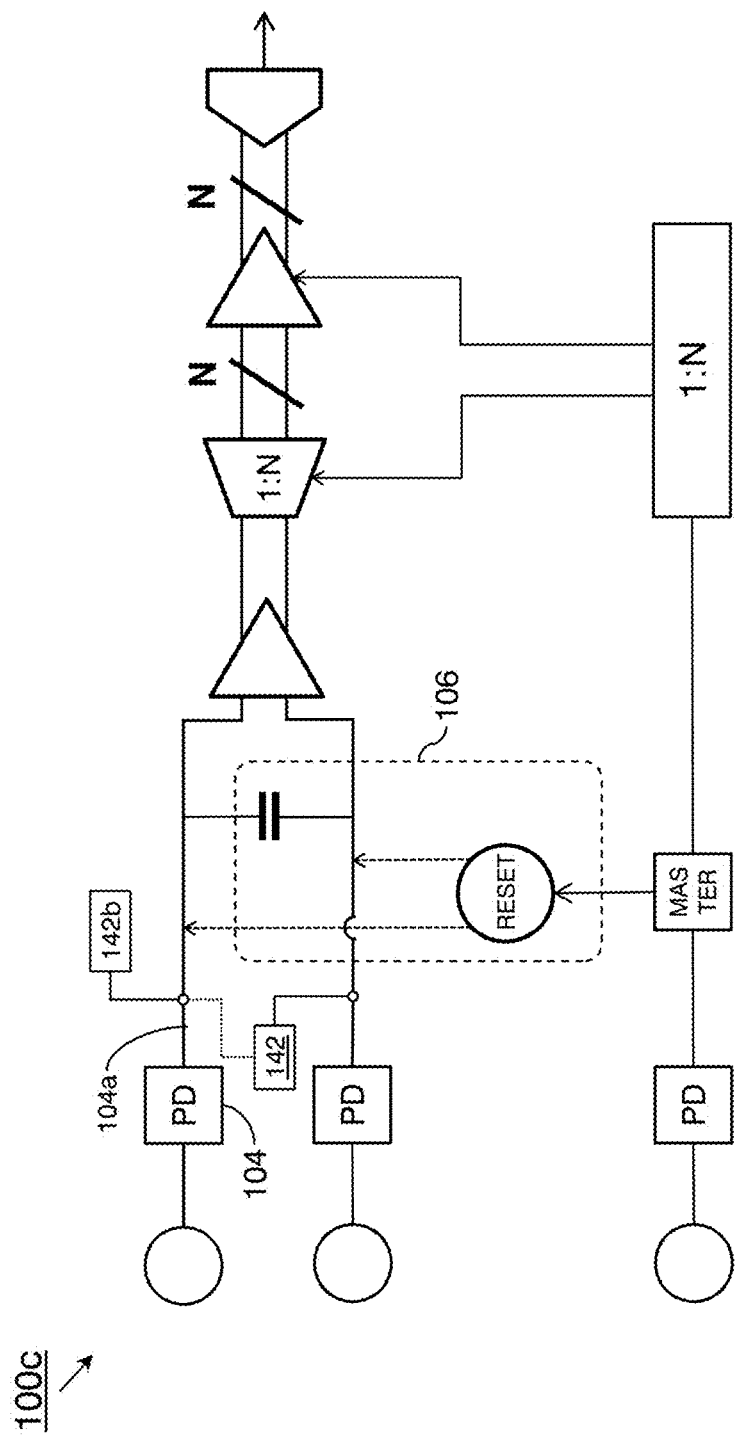
FIG. 3B is a diagrammatic illustration of the pADC front-end circuit of FIG. 3A.

Referring now to FIGS. 3A and 3B, the pADC front-end circuit 100c may be implemented and may function similarly to the pADC front-end circuit 100 of FIG. 1, except that the pADC front-end circuit 100c may include interconnecting impedance 140 serially connected between the photodetector 104 and the pADC front-end circuit 100c (via, for example, a DC blocking capacitor 140a) and a dampening circuit 142 for minimizing capacitor voltage ringing (at the integrating capacitor 112) associated with the current pulses 104a. Referring in particular to FIG. 3A, the dampening circuit 142 may include, but is not limited to, one or more dampening resistors (142a) (e.g., providing resistance varying from 1-20$\Omega$). Referring in particular to FIG. 3B, a single dampening circuit 142 may be serially connected to multiple photodetectors 104, or each photodetector 104 may be serially connected to a distinct dampening circuit (142, 142b).

Referring to FIG. 3C, the effect of capacitor voltage ringing in the pADC front-end circuit 100 of FIG. 1 is shown. Photonic ADC circuits, such as the voltage-mode pADC front-end circuit 100 of FIG. 1 as well as current-mode pADC circuits, may exhibit current ringing or voltage ringing, e.g., associated with the current pulses 104a or the capacitor voltage 112a onto which the current pulses 104a are integrated. For example, the capacitor voltage 112a may represent an ideal capacitor voltage that settles (at the integrating capacitor 112, FIG. 1) with minimal interconnecting impedance. However, the introduction of interconnecting impedance to the pADC front-end circuit 100 (140, FIG. 3A) may prevent the capacitor voltage from settling due to ringing (112b). The addition of the dampening circuit (142, FIGS. 3A/B) may alleviate ringing, allowing the capacitor voltage (112c) to settle at the end of the pulse.

Figure 4:
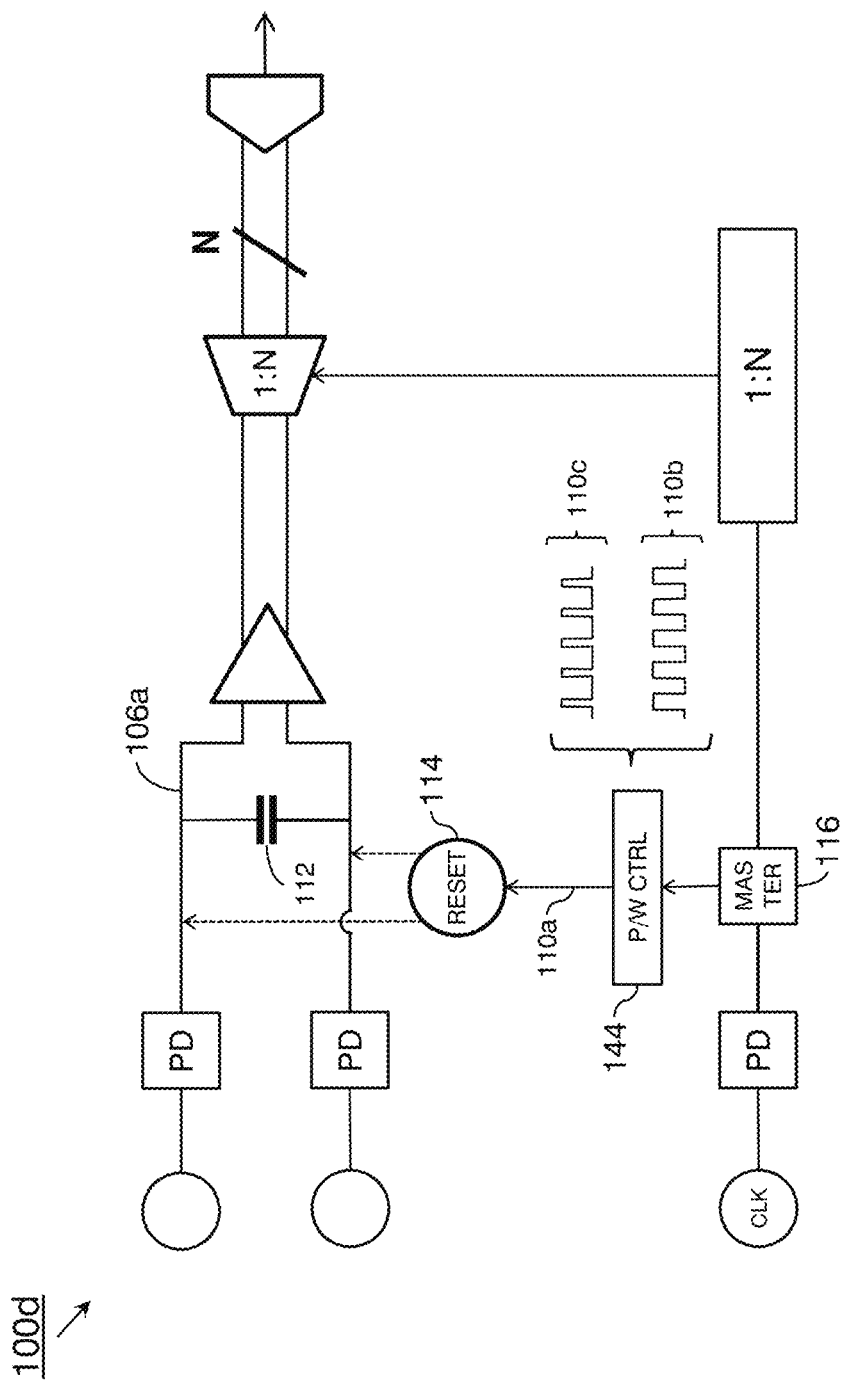
FIG. 4 is a diagrammatic illustration of an ISI-reducing implementation of the pADC front-end circuit of FIG. 2A.

Referring to FIG. 4, the pADC front-end circuit 100d may be implemented and may function similarly to the pADC front-end circuit 100 of FIG. 1 or the differential pADC front-end circuit 100a of FIG. 2, except that the pADC front-end circuit 100d may address ringing and potential ISI (see, e.g., FIG. 3C) by allowing more time for the capacitor voltage (112a, FIG. 3C) to settle at the integrating capacitor 112. For example, instead of a sample-and-hold differential amplifier (118, FIG. 1), the pADC front-end circuit 100d may incorporate a pulse width controller 144 for adjusting the duty cycle of the clock signal 110a generated by the master clock 116. Generally, the clock signal 110a may take the form of a 50-percent square wave duty cycle (110b); when the clock signal is "high," e.g., indicative of a logical-one, the reset switch 114 may reset the voltage across the integrating capacitor 112 to zero, and when the clock signal is "low," e.g., indicative of a logical-zero, the integrating capacitor 112 may hold the integrated voltage (106a). The pulse width controller 144 may, for example, narrow the pulse width of the clock signal to less than 50 percent "high" (110c), thereby providing more time in each duty cycle for the integrating capacitor 112 to hold the integrated voltage 106a. As the adjusted pulse width of the clock signal 110c allows for longer settling time of the capacitor voltage (112a-c, FIG. 3C), the redundant sample-and-hold differential amplifier (118, FIG. 1) may be removed.

As will be appreciated from the above, pADC front-end circuits according to embodiments of the inventive concepts disclosed herein may enable high-speed high-SNR operations by immediately integrating current pulses onto a capacitor voltage. The front-end circuits may further minimize current and voltage ringing and ISI via dampening or pulse-width control of clock signals, improving power efficiency by removing sample-and-hold amplifiers.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

I claim:

1. A photonic analog-digital converter (pADC) front-end circuit, comprising:
   at least one optical subsystem configured to generate one or more optical pulses corresponding to an analog input signal;
   at least one photodetector coupled to the optical subsystem and configured to generate one or more current pulses corresponding to the one or more optical pulses;
   at least one current integrator coupled to the at least one photodetector and configured to output at least one integrated voltage signal corresponding to the one or more current pulses, the at least one current integrator comprising:
      an integrating capacitor configured to integrate the one or more current pulses onto a capacitor voltage; and
      a reset switch coupled to the integrating capacitor and configured to reset the capacitor voltage according to a clock signal;
   at least one clock subsystem coupled to the reset switch and configured to generate the at least one clock signal; and
   one or more signal processors coupled to the current integrator and configured to generate at least one digital output signal corresponding to the at least one integrated voltage signal.

2. The pADC front-end circuit of claim 1, wherein the one or more signal processors include:
   at least one amplifier configured to sample the integrated voltage signal; and
   at least one quantizer coupled to the amplifier and configured to generate the at least one digital output signal based on the sampled integrated voltage signal.

3. The pADC front-end circuit of claim 2, wherein the at least one clock signal is a first clock signal and the at least one amplifier includes a plurality of N amplifiers, where N is an integer, further comprising:
- at least one demultiplexer coupled to the current integrator, the demultiplexer configured to split the at least one integrated voltage signal into N signal channels based on a second clock signal; and
- at least one clock divider coupled to the demultiplexer and to the clock subsystem, the clock divider configured to determine the at least one second clock signal based on the first clock signal.

4. The pADC front-end circuit of claim 1, further comprising:
- at least one dampening circuit serially coupled to the at least one photodetector, the dampening circuit configured to reduce voltage ringing associated with the at least one integrating capacitor.

5. The pADC front-end circuit of claim 4, wherein the dampening circuit includes at least one dampening resistor.

6. The pADC front-end circuit of claim 1, wherein:
- the at least one photodetector includes at least 1) a first photodetector coupled to the optical subsystem and configured to generate one or more in-phase current pulses corresponding to an in-phase (I) component of the one or more optical pulses and 2) a second photodetector coupled to the optical subsystem and configured to generate one or more quadrature current pulses corresponding to a quadrature (Q) component of the one or more optical pulses; and
- the at least one current integrator includes at least 1) a first current integrator coupled to the at least one first photodetector and configured to output at least one in-phase integrated voltage signal corresponding to the one or more in-phase current pulses and 2) a second current integrator coupled to the at least one second photodetector and configured to output at least one quadrature integrated voltage signal corresponding to the one or more quadrature current pulses; and
- the one or more signal processors are configured to generate at least one in-phase digital output signal corresponding to the at least one in-phase integrated voltage signal and at least one quadrature digital output signal corresponding to the at least one quadrature integrated voltage signal.

7. The pADC front-end circuit of claim 1, wherein the circuit is embodied in a receiver configured to receive the at least one analog input signal via one or more antenna elements.

8. A differential pADC front-end circuit, comprising:
- a first optical subsystem configured to generate one or more first optical pulses corresponding to an analog input signal;
- a second optical subsystem configured to generate one or more second optical pulses corresponding to the analog input signal;
- at least one first photodetector coupled to the first optical subsystem and configured to generate one or more first current pulses corresponding to the one or more first optical pulses;
- at least one second photodetector coupled to the second optical subsystem and configured to generate one or more second current pulses corresponding to the one or more second optical pulses;
- at least one current integrator coupled to the first photodetector and the second photodetector and configured to output at least one of a first integrated voltage signal corresponding to the one or more first current pulses and a second integrated voltage signal corresponding to the one or more second current pulses, the at least one current integrator comprising:
  - an integrating capacitor configured to integrate onto a capacitor voltage at least one of the one or more first current pulses and the one or more second current pulses; and
  - a reset switch coupled to the integrating capacitor and configured to reset the capacitor voltage according to a clock signal;
- at least one clock subsystem coupled to the reset switch and configured to generate the at least one clock signal;
- at least one differential amplifier coupled to the current integrator and configured to:
  - receive the at least one first integrated voltage signal and the at least one second integrated voltage signal from the current integrator;
  - generate at least one differential voltage signal based on the first integrated voltage signal and the second integrated voltage signal;
- and
- one or more signal processors coupled to the differential amplifier configured to generate at least one digital output signal corresponding to the at least one differential voltage signal.

9. The differential pADC front-end circuit of claim 8, wherein the at least one differential amplifier is a first differential amplifier and the one or more signal processors include:
- at least one second differential amplifier configured to sample the differential voltage signal; and
- at least one quantizer coupled to the amplifier and configured to generate the at least one digital output signal based on the sampled differential voltage signal.

10. The differential pADC front-end circuit of claim 9, wherein the at least one clock signal is a first clock signal and the at least one differential amplifier includes a plurality of N differential amplifiers, where N is an integer, further comprising:
- at least one demultiplexer coupled to the current integrator, the demultiplexer configured to split the at least one differential voltage signal into N signal channels based on a second clock signal; and
- at least one clock divider coupled to the demultiplexer and to the clock subsystem, the clock divider configured to determine the at least one second clock signal based on the first clock signal.

11. The differential pADC front-end circuit of claim 8, further comprising:
- at least one dampening circuit serially coupled to one or more of the first photodetector and the second photodetector, the dampening circuit configured to reduce voltage ringing associated with the at least one integrating capacitor.

12. The differential pADC front-end circuit of claim 11, wherein the dampening circuit includes at least one dampening resistor.

13. The differential pADC front-end circuit of claim 8, wherein:
- the at least one first photodetector is configured to generate one or more in-phase current pulses corresponding to an in-phase (I) component of the one or more optical pulses;

the at least one second photodetector is configured to generate one or more quadrature current pulses corresponding to a quadrature (Q) component of the one or more optical pulses;

the at least one current integrator includes at least 1) a first current integrator coupled to the at least one first photodetector and configured to output at least one in-phase integrated voltage signal corresponding to the one or more in-phase current pulses and 2) a second current integrator coupled to the at least one second photodetector and configured to output at least one quadrature integrated voltage signal corresponding to the one or more quadrature current pulses;

the at least one differential amplifier includes at least 1) a first differential amplifier configured to generate at least one in-phase differential voltage signal based on the in-phase integrated voltage signal and 2) a second differential amplifier configured to generate at least one quadrature differential voltage signal based on the quadrature integrated voltage signal;

and the one or more signal processors are configured to generate at least one in-phase digital output signal corresponding to the at least one in-phase differential voltage signal and at least one quadrature digital output signal corresponding to the at least one quadrature differential voltage signal.

14. A pADC front-end circuit, comprising:
at least one optical subsystem configured to generate one or more optical pulses corresponding to an analog input signal;
at least one photodetector coupled to the optical subsystem and configured to generate one or more current pulses corresponding to the one or more optical pulses;
at least one current integrator coupled to the at least one photodetector and configured to output at least one integrated voltage signal corresponding to the one or more current pulses, the at least one current integrator comprising:
an integrating capacitor configured to integrate the one or more current pulses onto a capacitor voltage; and
a reset switch coupled to the integrating capacitor and configured to reset the capacitor voltage based on at least one clock signal;
a pulse controller coupled to the reset switch and configured to adjust a pulse-width of the at least one clock signal;
at least one clock subsystem coupled to the reset switch and configured to generate the at least one clock signal;
and
one or more signal processors coupled to the current integrator, the one or more signal processors including one or more quantizers configured to generate at least one digital output signal corresponding to the at least one integrated voltage signal.

15. The pADC front-end circuit of claim 14, wherein:
the at least one optical subsystem comprises
a first optical subsystem configured to generate one or more first optical pulses; and
a second optical subsystem configured to generate one or more second optical pulses;
the at least one photodetector comprises
a first photodetector configured to generate one or more first current pulses corresponding to the one or more first optical pulses; and
a second photodetector configured to generate one or more second current pulses corresponding to the one or more second optical pulses;
the at least one integrated voltage signal comprises
a first integrated voltage signal corresponding to the one or more first current pulses; and
a second integrated voltage signal corresponding to the one or more second current pulses;
and
the one or more signal processors includes at least one differential amplifier configured to
receive the at least one first integrated voltage signal and the at least one second integrated voltage signal from the current integrator;
generate at least one differential voltage signal based on the first integrated voltage signal and the second integrated voltage signal;
and
the one or more quantizers are configured to generate the at least one digital output signal based on the at least one differential voltage signal.

16. The pADC front-end circuit of claim 15, wherein:
the at least one first photodetector is configured to generate one or more in-phase current pulses corresponding to an in-phase (I) component of the one or more optical pulses;
the at least one second photodetector is configured to generate one or more quadrature current pulses corresponding to a quadrature (Q) component of the one or more optical pulses;
the at least one current integrator includes at least 1) a first current integrator coupled to the at least one first photodetector and configured to output at least one in-phase integrated voltage signal corresponding to the one or more in-phase current pulses and 2) a second current integrator coupled to the at least one second photodetector and configured to output at least one quadrature integrated voltage signal corresponding to the one or more quadrature current pulses;
and
the one or more quantizers are configured to generate at least one in-phase digital output signal corresponding to the at least one in-phase integrated voltage signal and at least one quadrature digital output signal corresponding to the at least one quadrature integrated voltage signal.

17. The pADC front-end circuit of claim 14, wherein the at least one clock signal is a first clock signal and the one or more quantizers include a plurality of N quantizers, where N is an integer, further comprising:
at least one demultiplexer coupled to the current integrator, the demultiplexer configured to split the at least one integrated voltage signal into N signal channels based on a second clock signal;
at least one clock divider coupled to the demultiplexer and to the clock subsystem, the clock divider configured to determine the second clock signal based on the first clock signal.

18. The pADC front-end circuit of claim 14, further comprising:
at least one dampening circuit serially coupled to the at least one photodetector, the dampening circuit configured to reduce voltage ringing associated with the at least one integrating capacitor.

19. The pADC front-end circuit of claim 18, wherein the dampening circuit includes at least one dampening resistor.

20. The pADC front-end circuit of claim 14, wherein the circuit is embodied in a receiver configured to receive the at least one analog input signal via one or more antenna elements.

* * * * *